United States Patent
Duncan et al.

(10) Patent No.: US 12,396,139 B2
(45) Date of Patent: Aug. 19, 2025

(54) SYSTEM AND METHOD FOR THERMAL MANAGEMENT USING LIQUID COOLING

(71) Applicant: Dell Products L.P., Round Rock, TX (US)

(72) Inventors: Tyler Baxter Duncan, Austin, TX (US); Anthony Middleton, Cedar Park, TX (US); Ty Robert Schmitt, Round Rock, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 531 days.

(21) Appl. No.: 17/971,161

(22) Filed: Oct. 21, 2022

(65) Prior Publication Data

US 2024/0138123 A1 Apr. 25, 2024
US 2024/0237302 A9 Jul. 11, 2024

(51) Int. Cl.
H05K 7/20 (2006.01)

(52) U.S. Cl.
CPC ..... H05K 7/20781 (2013.01); H05K 7/20272 (2013.01)

(58) Field of Classification Search
CPC .................. H05K 7/20272; H05K 7/20781
USPC ....................................................... 165/281
See application file for complete search history.

(56) References Cited

U.S. PATENT DOCUMENTS

| | | | | |
|---|---|---|---|---|
| 7,216,064 B1 * | 5/2007 | Pippin | ................ | G06F 11/3058 |
| | | | | 327/512 |
| 8,387,249 B2 * | 3/2013 | Campbell | .......... | H05K 7/20781 |
| | | | | 29/890.03 |
| 11,670,564 B2 * | 6/2023 | Poltorak | ............ | H05K 7/20154 |
| | | | | 165/281 |
| 12,314,095 B2 * | 5/2025 | Franz | ................. | H05K 7/20709 |
| 2007/0227710 A1 * | 10/2007 | Belady | ................. | H05K 7/2079 |
| | | | | 165/122 |
| 2010/0236772 A1 * | 9/2010 | Novotny | ............ | H05K 7/20836 |
| | | | | 165/287 |
| 2014/0068943 A1 * | 3/2014 | Campbell | ............... | B21D 53/02 |
| | | | | 29/890.035 |
| 2014/0069111 A1 * | 3/2014 | Campbell | ............... | F25B 21/02 |
| | | | | 29/890.035 |
| 2015/0181762 A1 * | 6/2015 | Boyd | ................. | H05K 7/20236 |
| | | | | 165/104.33 |
| 2019/0037730 A1 * | 1/2019 | Gao | .................... | H05K 7/20281 |
| 2022/0071063 A1 * | 3/2022 | Heydari | ............. | H05K 7/20772 |
| 2024/0138123 A1 * | 4/2024 | Duncan | .............. | H05K 7/20272 |

* cited by examiner

*Primary Examiner* — Devon Lane
(74) *Attorney, Agent, or Firm* — Chamberlain, Hrdlicka, White, Williams & Aughtry; Aly Z. Dossa

(57) ABSTRACT

An information handling system includes a chassis that includes a chassis inlet and a chassis outlet and a liquid cooling system that includes a first manifold. The first manifold includes a first chassis outlet configured to provide a first inlet coolant flow to the chassis inlet and a first chassis inlet configured to receive a first outlet coolant flow from the chassis outlet. The liquid cooling system also includes a second manifold that includes a second chassis outlet configured to provide the first inlet coolant flow to the chassis inlet, and a second chassis inlet configured to receive the first outlet coolant flow from the chassis outlet.

20 Claims, 9 Drawing Sheets

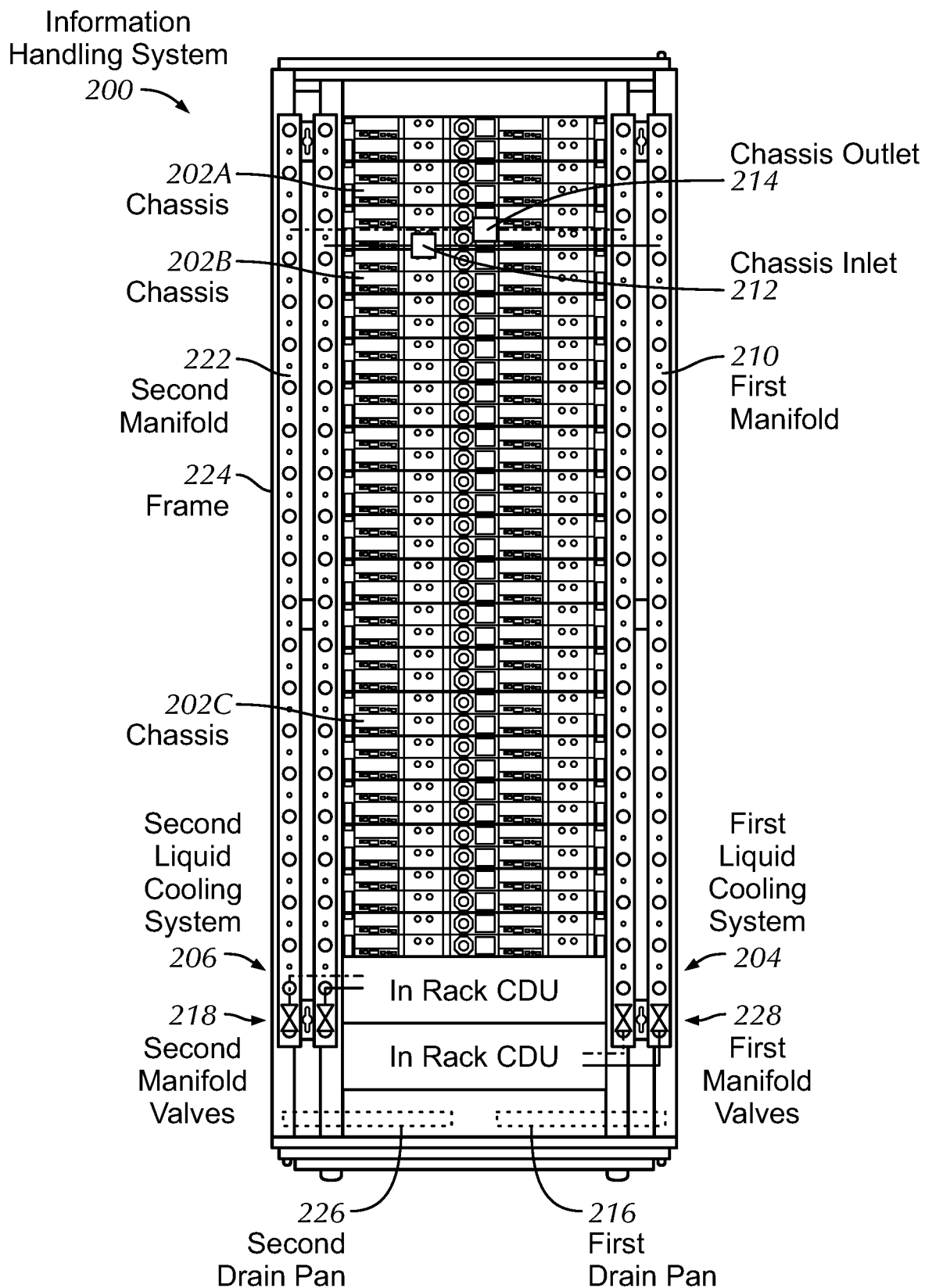
FIG. 2.1

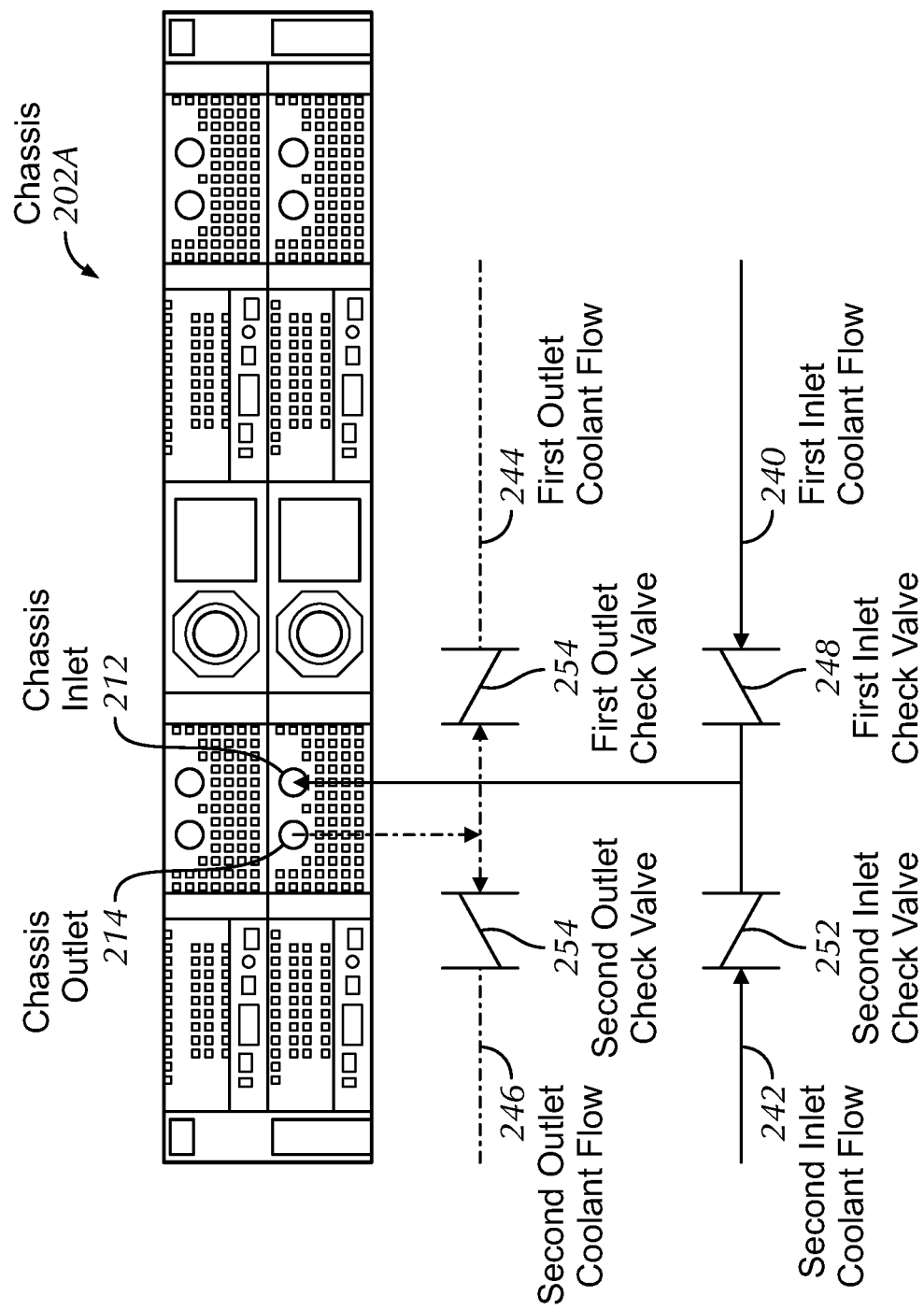
FIG. 2.2

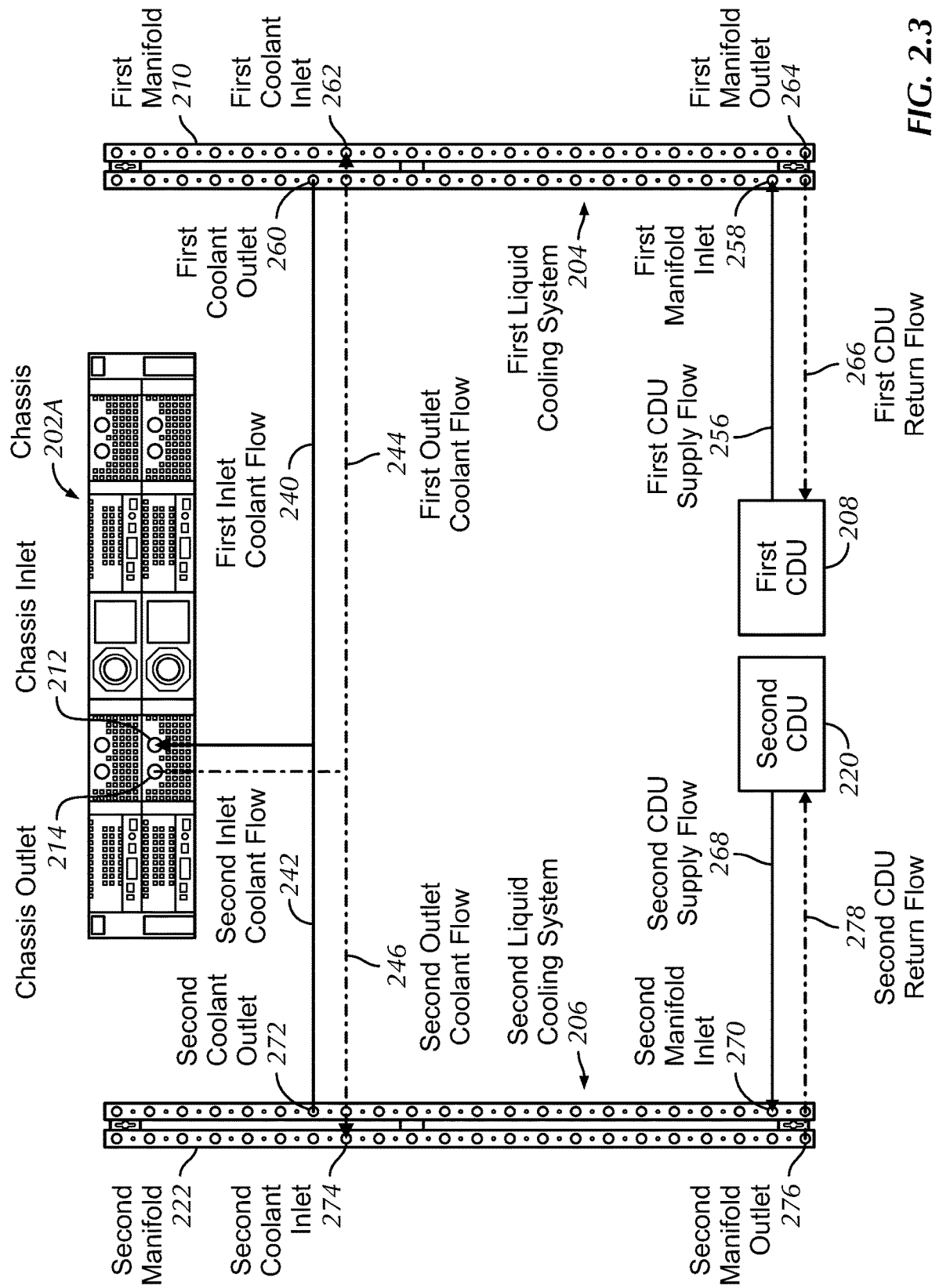
FIG. 2.3

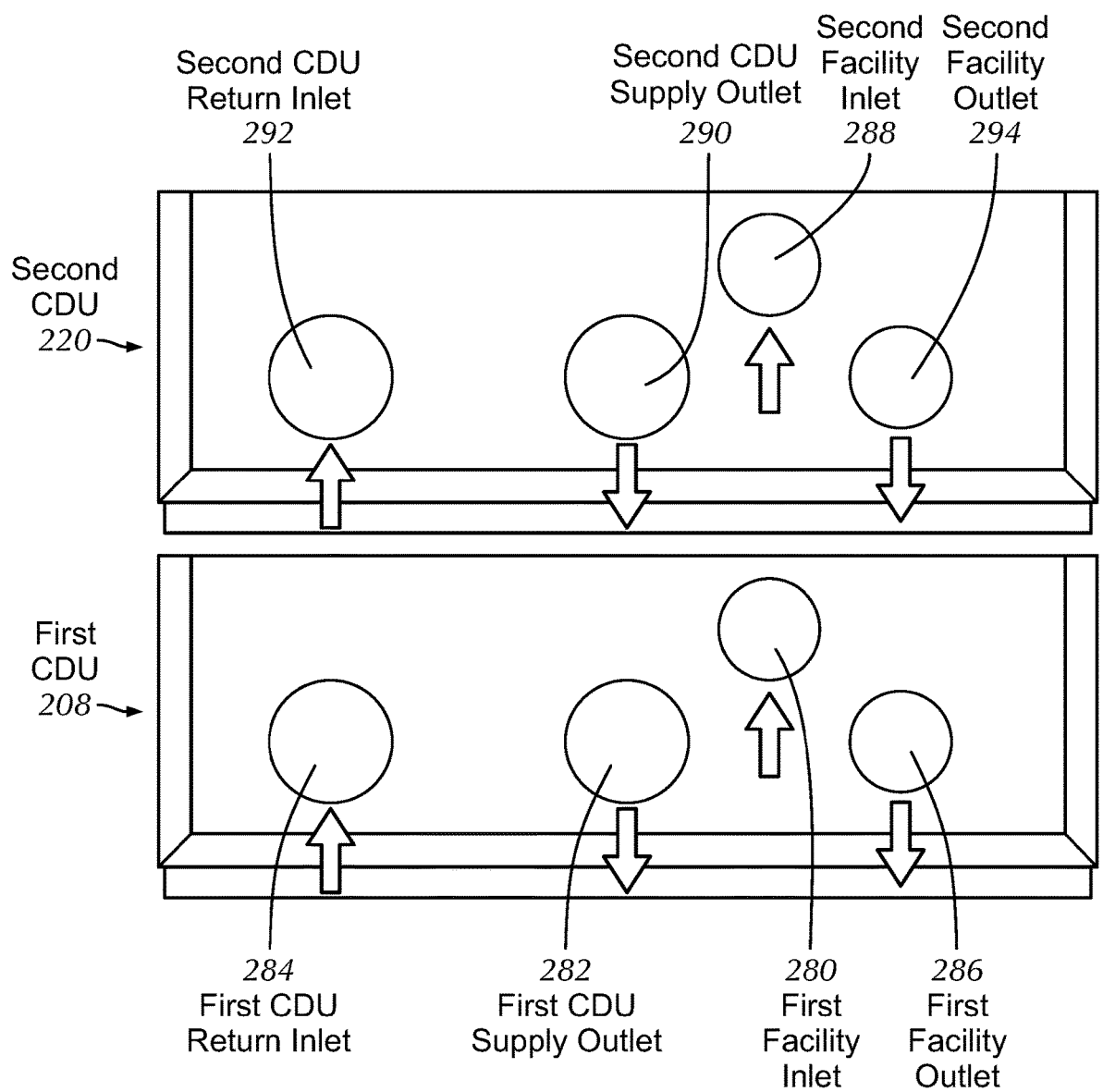
FIG. 2.4

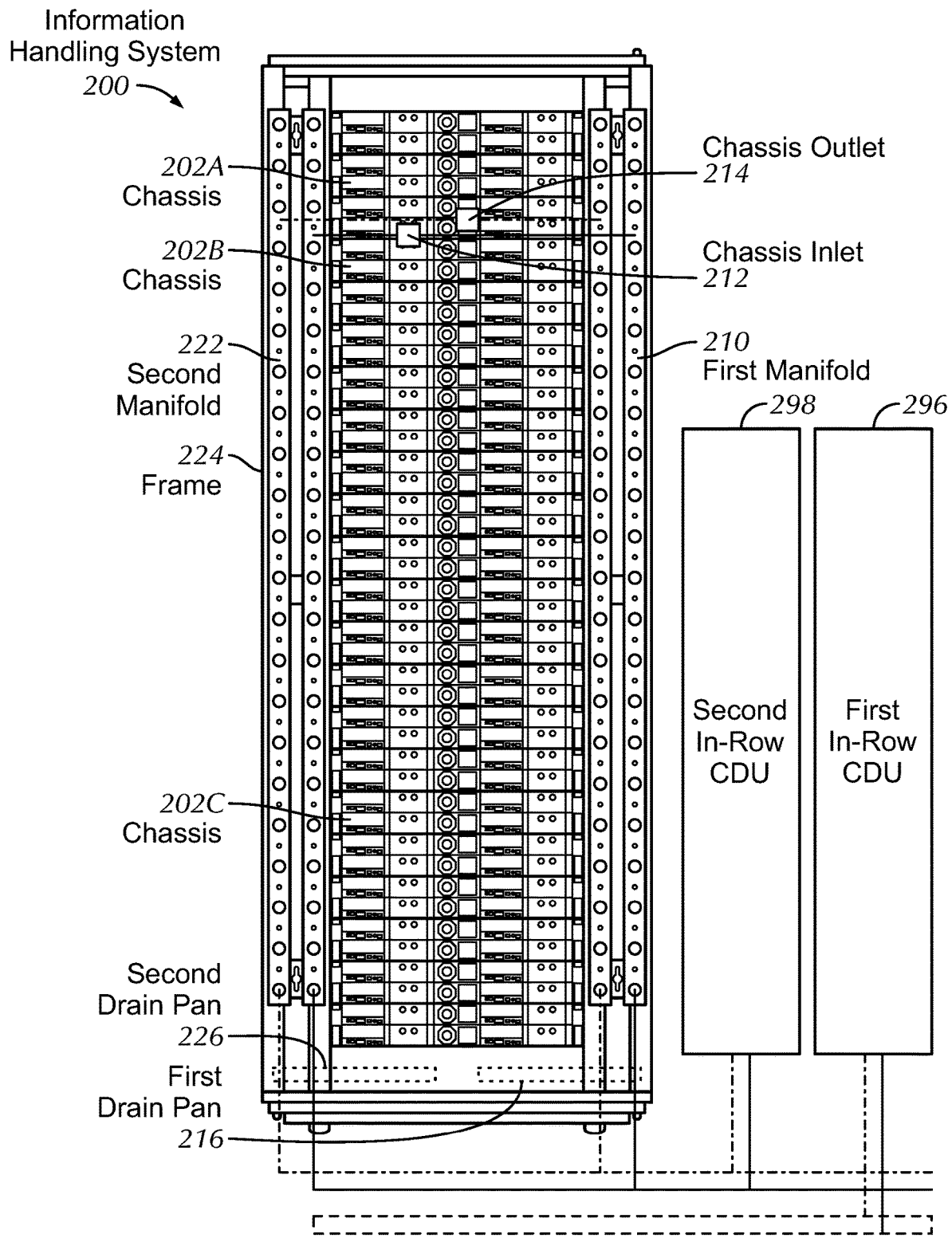
*FIG. 2.5*

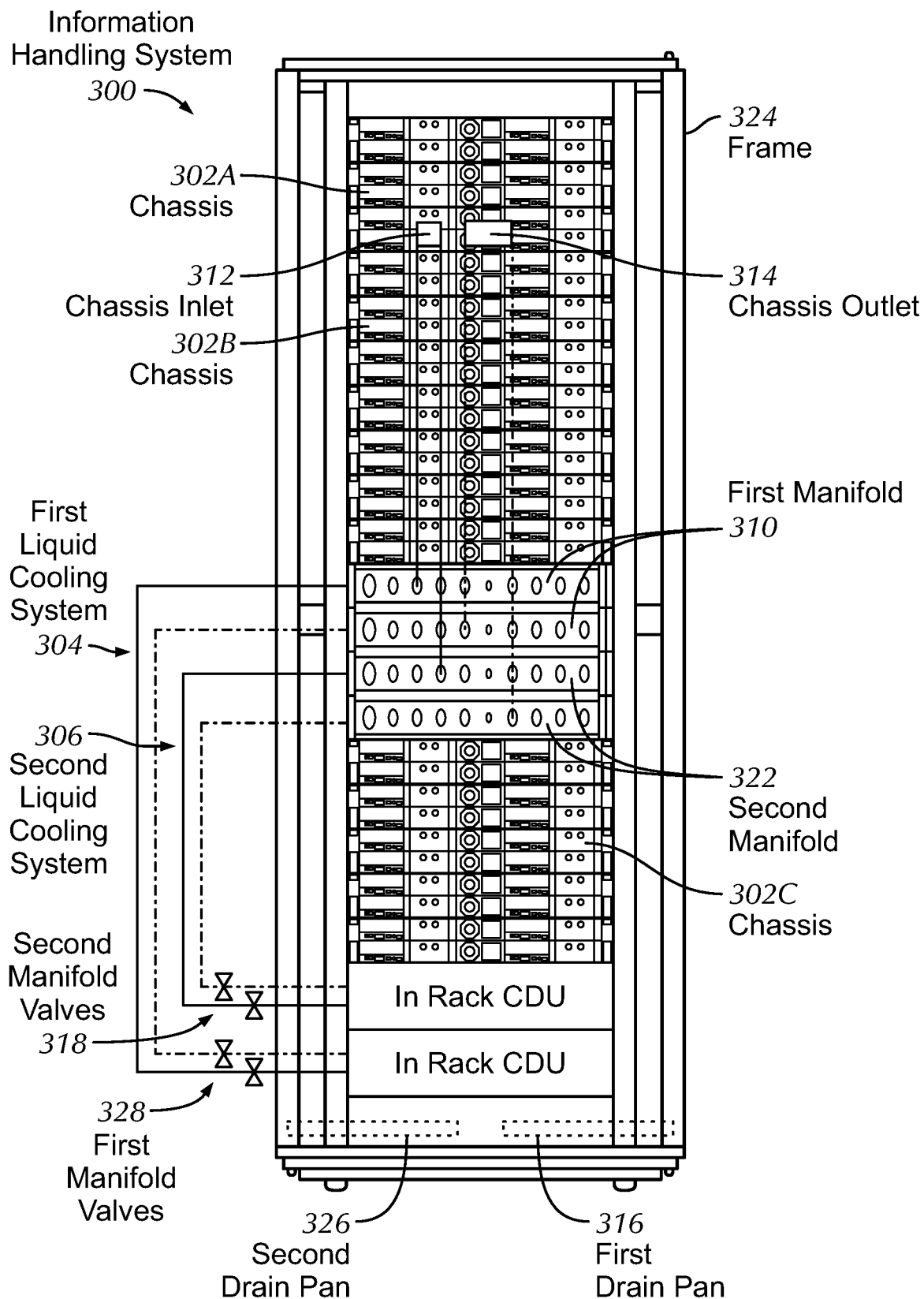
FIG. 3.1

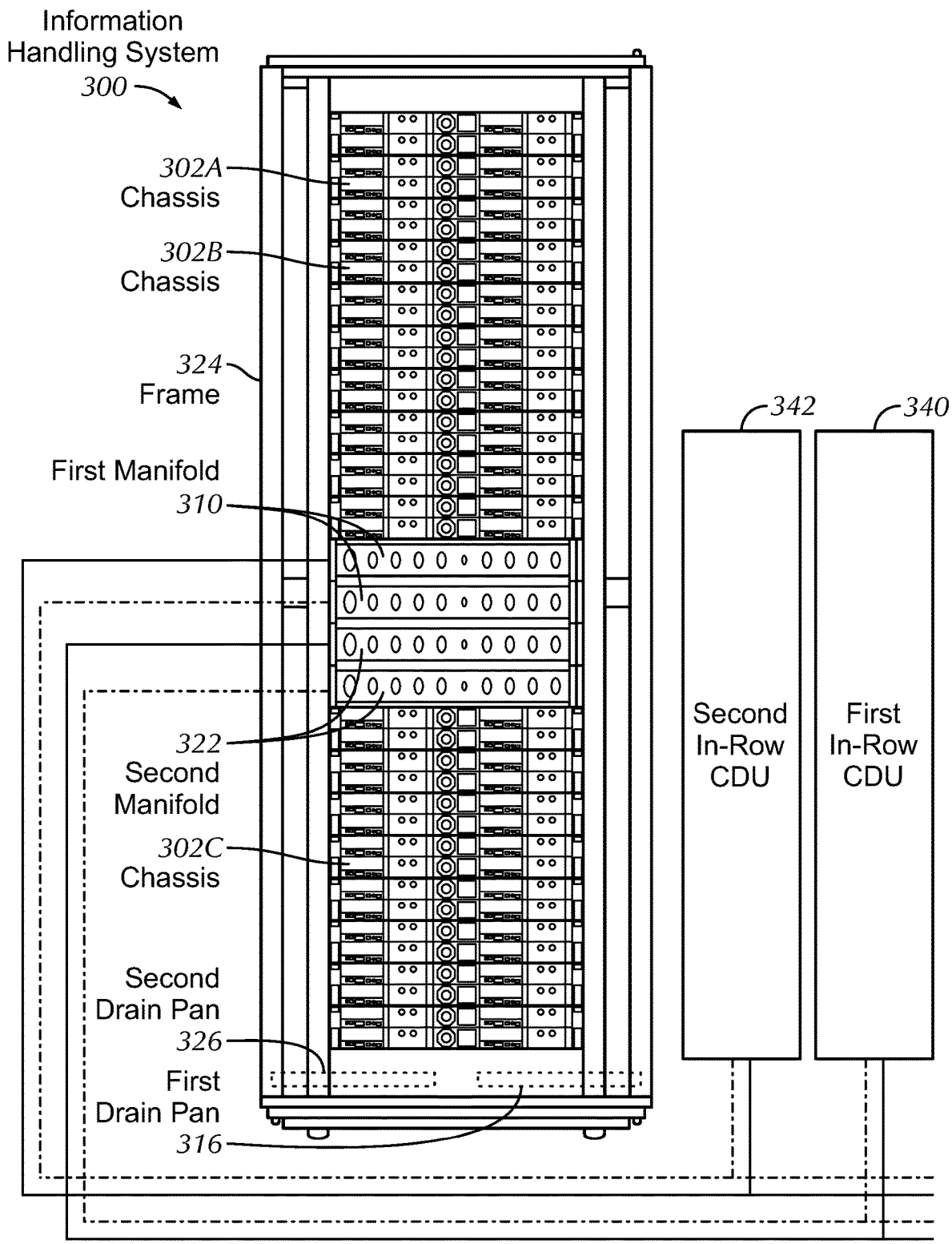
FIG. 3.2

SYSTEM AND METHOD FOR THERMAL MANAGEMENT USING LIQUID COOLING

BACKGROUND

As the value and use of information continues to increase, individuals and businesses seek additional ways to process and store information. One option available to users is information handling systems. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Use cases for information handling systems are causing progressively larger number of information handling systems to be disposed near each other. For example, rack mount systems utilize a rack structure to stack two or more chassis in an information handling system. Due to the changing uses of information handling systems, chassis therein may be modular allowing for continual partial upgrades to the information handling system. That is, an information handling system may be composed of multiple chassis that may be attached to each other to form the information handling systems. When the multiple chassis are attached, components of the information handling system disposed in each of the chassis may become operably connected to each other.

SUMMARY

In general, in one aspect, an information handling system in accordance with one or more embodiments of the invention includes multiple chassis, each including a chassis inlet and a chassis outlet. The information handling system also includes a liquid cooling system that includes a first coolant distribution unit including a first unit inlet and a first unit outlet and a first manifold. The first manifold includes multiple first coolant outlets each configured to provide a first inlet coolant flow to a respective one of the chassis inlets and multiple first coolant inlets each configured to receive a first outlet coolant flow from a respective one of the chassis outlets. Further, the first manifold includes a first manifold inlet fluidly coupled to the first unit outlet and configured to provide the first inlet coolant flow, and a first manifold outlet fluidly coupled to the first unit inlet and configured to provide the first outlet coolant flow to the first coolant distribution unit. In addition, the liquid cooling system includes a second coolant distribution unit including a second unit inlet and a second unit outlet and a second manifold. The second manifold includes a plurality of second coolant outlets, each configured to provide a second coolant flow to the respective one of the chassis inlets; multiple second coolant inlets, each configured to receive a second outlet coolant flow from the respective one of the chassis outlets; a second manifold inlet fluidly coupled to the second unit outlet and configured to provide the second inlet coolant flow; and a second manifold outlet fluidly coupled to the second unit inlet, configured to provide the second outlet coolant flow from the second section to the second coolant distribution unit.

In general, in one aspect, an information handling system in accordance with one or more embodiments of the invention includes a chassis that includes a chassis inlet and a chassis outlet and a liquid cooling system that includes a first manifold. The first manifold includes a first chassis outlet configured to provide a first inlet coolant flow to the chassis inlet and a first chassis inlet configured to receive a first outlet coolant flow from the chassis outlet. The liquid cooling system also includes a second manifold that includes a second chassis outlet configured to provide the first inlet coolant flow to the chassis inlet, and a second chassis inlet configured to receive the first outlet coolant flow from the chassis outlet.

In general, in one aspect, an information handling system in accordance with one or more embodiments of the invention includes multiple chassis each including a chassis inlet and a chassis outlet. The information handling system also includes a liquid cooling system that includes a first coolant distribution unit including a first unit inlet and a first unit outlet and a first manifold. The first manifold includes multiple first coolant outlets each configured to provide a first inlet coolant flow to a respective one of the chassis inlets and multiple first coolant inlets each configured to receive a first outlet coolant flow from a respective one of the chassis outlets. Further, the first manifold includes a first manifold inlet fluidly coupled to the first unit outlet and configured to provide the first inlet coolant flow, and a first manifold outlet fluidly coupled to the first unit inlet and configured to provide the first outlet coolant flow to the first coolant distribution unit. Moreover, the first manifold includes a first inlet check valve fluidly coupled between the respective one of the chassis inlets and the respective one of the first coolant outlets, the first inlet check valve is configured to close in response to a pressure of the first inlet coolant flow being below a first threshold. Further, the first manifold includes a first outlet check valve fluidly coupled between the respective one of the chassis outlets and the respective one of the first coolant inlets, wherein the first outlet check valve is configured to close in response to a pressure of the first outlet coolant flow being below a first threshold In addition, the liquid cooling system includes a second coolant distribution unit including a second unit inlet and a second unit outlet and a second manifold. The second manifold includes a plurality of second coolant outlets each configured to provide a second coolant flow to the respective one of the chassis inlets, multiple second coolant inlets each configured to receive a second outlet coolant flow from the respective one of the chassis outlets, a second manifold inlet fluidly coupled to the second unit outlet and configured to provide the second inlet coolant flow, and a second manifold outlet fluidly coupled to the second unit inlet and configured to provide the second outlet coolant flow from the second section to the second coolant distribution unit. The second manifold includes a second outlet check valve fluidly coupled between the respective one of the chassis outlets and the respective one of the second coolant inlets, the second outlet check valve is configured to close in response to a pressure of the second outlet coolant flow being below a second threshold. In addition, the second manifold includes a second inlet check valve fluidly coupled between the respective one of the chassis inlets and the respective one of the second coolant outlets, the second inlet check valve is configured to close in response to a pressure of the second inlet coolant flow being below a second threshold.

Other aspects of the invention will be apparent from the following description and the appended claims.

BRIEF DESCRIPTION OF DRAWINGS

FIG. 2.1 shows a diagram of an information handling system in accordance with one or more embodiments of the invention.

FIG. 2.2 shows a diagram of a chassis of an information handling system in accordance with one or more embodiments of the invention.

FIG. 2.3 shows a diagram of a liquid cooling system of an information handling system in accordance with one or more embodiments of the invention.

FIG. 2.4 shows a back view diagram of coolant distribution units in accordance with one or more embodiments of the invention.

FIG. 2.5 shows a diagram of an information handling system in accordance with one or more embodiments of the invention.

FIG. 3.1 shows a diagram of an information handling system in accordance with one or more embodiments of the invention.

FIG. 3.2 shows a diagram of an information handling system in accordance with one or more embodiments of the invention.

DETAILED DESCRIPTION

Figure 1:
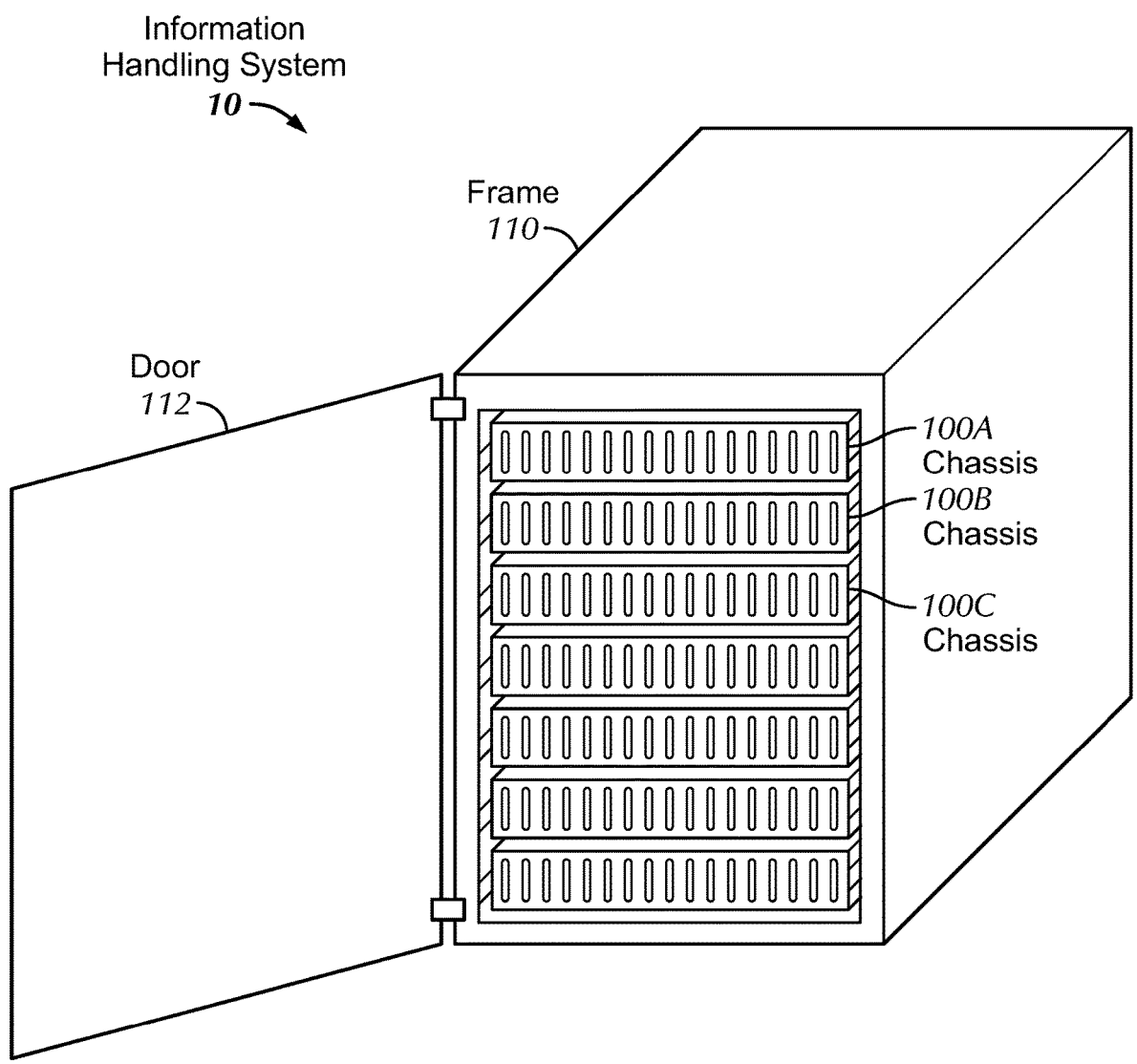
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

In general, embodiments of the invention relate to systems, devices, and methods for managing components of an information handling system. An information handling system (IHS) may be a system that provides computer implemented services. These services may include, for example, database services, electronic communication services, data storage services, etc.

To provide these services, the information handling system may include one or more computing devices. The computing devices may include any number of computing components that facilitate providing of the services of the information handling system. The computing components may include, for example, processors, memory modules, circuit cards that interconnect these components, etc.

During operation, these components may generate heat and require fluid (e.g., liquid) flows to maintain the temperatures of these components within nominal ranges. Embodiments of the invention may provide systems that thermally manage IHSs. Generally, liquids have a higher heat capacity than air, and thus may be capable of removing more heat from IHSs than air. In some embodiments, a combination of air and liquid cooling may be used. However, liquid cooling systems may degrade over time and develop leaks, which may cause damage to components in IHSs.

To increase the reliability and resiliency of a liquid cooling system, embodiments of the invention may provide redundant cooling components such as manifolds. Thus, if one of the manifolds fails and/or develops a leak or if a manifold is closed off for some other purpose (e.g., maintenance), the manifold be taken offline while a supply of liquid coolant flow to the IHS is maintained by the redundant manifold. By doing so, a system in accordance with embodiments of the invention may be less likely to prematurely fail and reduce liquid system cooling downtime, which may also reduce the amount of time the IHS spends in an unoptimized state.

FIG. 1.1 shows an information handling system (10) in accordance with one or more embodiments of the invention. The system may include a frame (110) and any number of chassis (e.g., 100A, 100B, 100C).

As will be discussed in greater detail below, the information handling system (10) may include any number of cooling components. A cooling component may be a device that may be used to thermally condition fluid flows used to thermally management components of the information handling system. The cooling components provide fluid flows at a chassis level to provide liquid cooling for components within the chassis.

The frame (110) may be a mechanical structure that enables chassis to be positioned with respect to one another. For example, the frame (110) may be a rack mount enclosure that enables chassis to be disposed within it. The frame (110) may be implemented as other types of structures adapted to house, position, orient, and/or otherwise physically, mechanically, electrically, and/or thermally manage chassis (e.g., direct airflows to the chassis). By managing the chassis, the frame (110) may enable multiple chassis to be densely packed in space without negatively impacting the operation of the information handling system (10).

The frame may include a door (112) to selectively provide access to an interior portion of the information handling system (10). Further, multiple doors (112) may be utilized, with each door (112) selectively providing access to different sections of the information handling system (10). For example, different users may be provided access to different sections of the information handling system (10), which may enable the information handling system (10) to serve multiple users.

A chassis (e.g., 100A) may be a mechanical structure for housing components of an information handling system. For example, a chassis may be implemented as a rack mountable enclosure for housing components of an information handling system. The chassis may be adapted to be disposed within the frame (110) and/or utilize services provided by the frame (110) and/or other devices.

Any number of components may be disposed in each of the respective chassis (e.g., 100A, 100B, 100C). These components may be portions of computing devices that provide computer implemented services, discussed in greater detail below.

When the components provide computer implemented services, the components may generate heat. For example, the components may utilize electrical energy to perform computations and generate heat as a byproduct of performing the computations. If left unchecked, a buildup of heat within a chassis may cause temperatures of the components disposed within the chassis to exceed preferred ranges.

The preferred ranges may include a nominal range in which the components respectively operate: (i) without detriment and/or (ii) are likely to be able to continue to operate through a predetermined service life of a component. Consequently, it may be desirable to maintain the temperatures of the respective components within the preferred range (e.g., a nominal range).

When a component operates outside of the preferred range, the service life of the component may be reduced, the component may not be able to perform optimally (e.g., reduced ability to provide computations, higher likelihood of error introduced into computations, etc.), and/or the component may be more likely to unexpectedly fail. The component may be subject to other undesirable behavior when operating outside of the preferred range without departing from the invention.

To operate components within the preferred range of temperature, the chassis may include fluid exchanges. A fluid exchange may be one or more openings in an exterior of a chassis that enables the chassis to exchange fluid (e.g., liquid coolant) with a cooling system. For example, a chassis may utilize a fluid inlet to receive a fluid flow, then pass through the fluid flow through one or more internal heat exchangers to remove heat from one or more components contained within the chassis. The chassis may then utilize a fluid outlet to expel the now heated fluid flow to a cooling system configured to receive the fluid flow from the chassis. Consequently, the temperatures of components within the chassis may be reduced by utilizing the cooler fluid taken into the chassis via a fluid exchange.

Turning to FIG. 2.1, FIG. 2.1 shows a diagram of an information handling system (200) in accordance with one or more embodiments of the invention. The IHS (200) may include multiple chassis (e.g., 202A, 202B, 202C) disposed in the IHS (200).

As discussed above, the chassis may include computing devices that generate heat during operation. If left unchecked, a buildup of heat within a chassis may cause temperatures of the components disposed within the chassis to exceed preferred ranges. A first liquid cooling system (204) and a second liquid cooling system (206) are provided to remove heat from the chassis.

To do so, the first liquid cooling system (204) includes a first in-rack coolant distribution unit (CDU) (208) that provides a fluid flow to a first manifold (210). The first in-rack CDU (208) may include controllers (e.g., computing devices) to control flow characteristics, temperature, and/or pressure of fluid flowing through the first in-rack CDU (208). Further, the first in-rack CDU (208) may include a form factor such that it can fit in a space designed to fit a chassis.

Further, the first manifold (210) is mechanically coupled to a frame (224) of the IHS (200). The mechanical coupling between the frame (224) and the manifold provides structural support for the manifold while also positioning the inlets and outlets in a location convenient for fluid coupling. In one embodiment, the first manifold (210) is split into two pieces. The first piece may include inlets and the second piece may include outlets. The first manifold (210) may be split into more or less pieces without departing from the invention.

Continuing with the discussion of fluid flows, the liquid exits the first in-rack CDU (208) and flows along a first CDU supply flow and into the first manifold (210). The first manifold (210) includes outlets configured to supply fluid flows to the chassis and inlets configured to receive fluid flows from the chassis. For example, the first manifold (210) may include one outlet and one inlet for each chassis. The fluid then flows out of the first manifold (210) at a first coolant outlet and into chassis inlet (212). From there, the fluid passes through the chassis and exchanges heat with one or more components within the chassis to remove heat from the chassis. For a more detailed discussion of the fluid flows between the manifolds and the chassis, see FIG. 2.3 below.

Next, the fluid flows out of the chassis through a chassis outlet (214), and returns to the first manifold (210), entering the first manifold (210) through a first coolant inlet. The fluid then flows through the first manifold (210) and exits the manifold through a first manifold outlet. The fluid flows through a CDU return flow (see e.g., FIG. 2.3) and into the first in-rack CDU (208) through a first unit inlet. The fluid may then be processed (i.e., cooled) by the first in-rack CDU (208) and returned to the CDU supply flow, or the fluid may flow out of the first in-rack CDU (208) and flow into a facility return line to be processed elsewhere.

The first liquid cooling system (204) may also include a number of devices to improve the reliability of the first liquid cooling system (204) and/or prevent leaks from spreading and possibly damaging other components within the IHS (200). For example, the first liquid cooling system (204) includes a first drain pan (216) positioned below the first manifold (210). The first drain pan (216) may include a container to receive any leaks that may form in the first liquid cooling system (204), thus containing the leak to a controlled area and preventing a leak from affecting areas below the drain pan. Further, the first drain pan (216) may include sensors capable of detecting a presence of a leak and may also include a computing device capable of receiving data indicative of a leak and providing an alert that a leak has occurred. For additional details regarding computing devices, refer to FIG. 4.

Further, the liquid cooling system may contain one or more first manifold valves (218). The manifold valves (218) are positioned between the first in-rack CDU (208) and the first manifold (210) and can be actuated to selectively provide fluid flow between the first in-rack CDU (208) and the first manifold (210). In the event that a user wishes fluid to stop flowing through the first manifold (210) (e.g., during a service interval, upon detection of a leak, etc.) the first manifold valve (218) may be closed thereby stopping flow between the first in-rack CDU (208) and the first manifold (210). As will be discussed in greater detail in FIG. 2.2, there are also valves between the first manifold (210) and the chassis. Thus, a user can completely shut off fluid flows through the first manifold (310) while still maintaining liquid cooling for the IHS (e.g., via the second liquid cooling system (206)). Further, the first manifold valves (218) may be actuated manually or electronically. Electronic actuation of the first manifold valves (218) may be accomplished via a controller. For example, if a leak is detected (e.g., at the first drain pan (216)), the controller may actuate the first manifold valves (218) to block fluid flow between the first in-rack CDU (208) and the first manifold (210). The controller may be implemented using a computing device. For additional details regarding computing devices, refer to FIG. 4.

Any discussion relating to the first in-rack CDU (208) may apply to the second in-rack CDU (220), any discussion relating to the first manifold (210) may apply to the second manifold (222), any discussion relating to the first drain pan (216) may apply to the second drain pan (226), and any discussion relating to the first manifold valves (218) may apply to the second manifold valves (228).

By providing substantially the same functionality as the first liquid cooling system (204), the second liquid cooling system (206) provides enhanced reliability for the IHS (200). In turn, the IHS (200) may experience reduced downtime and may experience more time spent at maximum operating capacity due to continued liquid cooling during a manifold failure and/or maintenance.

Turning to FIG. 2.2, FIG. 2.2 shows a diagram of a representative chassis (202A) with liquid cooling in accordance with one or more embodiments of the invention. The following discussion may apply to any chassis within the IHS. As discussed above, the chassis (202A) receives a first inlet coolant flow (240) from the first manifold (not shown) and a second inlet coolant flow (242) from the second manifold (not shown) through the chassis inlet (212). The coolant flow then exchanges heat with components within the chassis (202A) and exits the chassis (202A) through a chassis outlet (214). Then the fluid flowing out of the chassis (202A) splits into a first outlet coolant flow (244) that flows back to the first manifold and a second outlet coolant flow (246) that flows back to the second manifold.

Each of the flows includes a check valve to prevent fluid from flowing when a respective manifold is shut off A first inlet check valve (248) and a first outlet check valve (250) are positioned between the first manifold and the chassis (202A), and a second inlet check valve (252) and a second outlet check valve (254) are positioned between the second manifold and the chassis (202A). The check valves are configured to stop fluid flow if the pressure is lower on the manifold side than the chassis (202A) side. Thus, if pressure drops in a respective manifold (e.g., due to being shut off and/or due to a leak), then the respective check valves will close preventing fluid from flowing between the respective manifold and the chassis (202A).

For example, if the first manifold experiences a pressure drop, both the first inlet check valve (248) and the first outlet check valve (250) will close. This prevents fluid from flowing between the first manifold and the chassis (202A), while allowing fluid to continue to flow between the second manifold and the chassis (202A).

Turning to FIG. 2.3, FIG. 2.3 shows a diagram of the first liquid cooling system (204) and the second liquid cooling system (206) providing fluid flows to a representative chassis (202A) in accordance with one or more embodiments of the invention. As discussed above, the first in-rack CDU (208) provides a coolant flow to the chassis (202A) via the first manifold (210). To do so, fluid flows out from the first in-rack CDU (208), through a first CDU supply flow (256), and into a first manifold inlet (258) of the first manifold (210). The fluid then flows through the first manifold (210) and is distributed to a chassis fluidly coupled to the first manifold (210). For illustrative purposes, only one chassis (202A) is shown coupled to the first manifold (210); however, any number of chassis may be fluidly coupled to the first manifold (210).

To distribute the fluid to the chassis (202A), the fluid flows out of the first manifold (210) through a first coolant outlet (260) and into the first inlet coolant flow (240). The fluid then flows into the chassis (202A) through the chassis inlet (212). The fluid then exchanges heat with one or more components within the chassis (202A) and exits the chassis (202A) through the chassis outlet (214). Then, the fluid flows through the first outlet coolant flow (244) to return to the first manifold (210) through a first coolant inlet (262) of the first manifold (210). The fluid then flows through the first manifold (210) where it may join other flows returning from other chassis. The fluid then flows out of the first manifold (210) through a first manifold outlet (264), through a first CDU return flow (266) and back into the first in-rack CDU (208). As discussed above, the first in-rack CDU (208) may then process the fluid and send it back through the first CDU supply flow (256), or the first in-rack CDU (208) may send the fluid to a facility return line so that the fluid may be processed elsewhere.

Similarly, the second in-rack CDU (220) provides a coolant flow to the chassis (202A) via the second manifold (222). To do so, fluid flows out from the second in-rack CDU (220), through a second CDU supply flow (268), and into a second manifold inlet (270) of the second manifold (222). The fluid then flows through the second manifold (222) and is distributed to a chassis fluidly coupled to the second manifold (222). For illustrative purposes, only one chassis (202A) is shown coupled to the second manifold (222); however, any number of chassis may be fluidly coupled to the second manifold (222).

To distribute the fluid to the chassis (202A), the fluid flows out of the second manifold (222) through a second coolant outlet (272) and into the second inlet coolant flow (242). The fluid then flows into the chassis (202A) through the chassis inlet (212). The fluid then exchanges heat with one or more components within the chassis (202A) and exits the chassis (202A) through the chassis outlet (214). Then, the fluid flows through the second outlet coolant flow (246) to return to the second manifold (222) through a second coolant inlet (274) of the second manifold (222). The fluid then flows through the second manifold (222) where it may join other flows returning from other chassis. The fluid then flows out of the second manifold (222) through a second manifold outlet (276), through a second CDU return flow (278) and back into the second in-rack CDU (220). As discussed above, the second in-rack CDU (220) may then process the fluid and send it back through the second CDU supply flow (268), or the second in-rack CDU (220) may send the fluid to a facility return line so that the fluid may be processed elsewhere.

Turning to FIG. 2.4, FIG. 2.4 shows a diagram of a backside of the first in-rack CDU (208) and the second in-rack CDU (220), in accordance with one or more embodiments of the invention. As discussed above, the CDUs may exchange fluid flows with manifolds coupled to an IHS and with a facility. To do so, the first in-rack CDU (208) includes a first facility inlet (280) which is fluidly coupled to a facility supply line and allows fluid to flow into the first in-rack CDU (208). The fluid is then processed by the first in-rack CDU (208) and exits the first in-rack CDU (208) at a first CDU supply outlet (282) where fluid then flows to the first manifold, as discussed above. Then, the fluid flows back from the first manifold and enters the first in-rack CDU (208) at a first CDU return inlet (284). Then, the first in-rack CDU (208) may reprocess the fluid and send it back through the first CDU supply outlet (282) and/or send the fluid out of a first facility outlet (286) to a facility return line to enable the fluid to be processed at some other location.

Similarly, the second in-rack CDU (220) includes a second facility inlet (288) which is fluidly coupled to a facility supply line and allows fluid to flow into the second in-rack CDU (220). The fluid is then processed by the second in-rack CDU (220) and exits the second in-rack CDU (220) at a second CDU supply outlet (290) where fluid then flows to the second manifold, as discussed above. Then, the fluid flows back from the second manifold and enters the second in-rack CDU (220) at a second CDU return inlet (292). Then, the second in-rack CDU (220) may reprocess the fluid and send it back through the second CDU supply outlet (290) and/or send the fluid out of a second facility outlet (294) to a facility return line to enable the fluid to be processed at some other location.

Turning to FIG. 2.5, FIG. 2.5 shows a diagram of the information handling system (200) in accordance with one or more embodiments of the invention. The present embodiment differs from the embodiment illustrated in FIG. 2.1 in that the first in-rack CDU (208) is replaced with a first in-row CDU (296) and the second in-rack CDU (220) is replaced with a second in-row CDU (298). The in-row CDUs differ from the in-rack CDUs in that they are not positioned within the frame (224) of the IHS (200). Rather, they are positioned at some other location. In this manner, the in-row CDUs may include a different form factor than in-rack CDUs. In some embodiments, in-row CDUs may be larger than in-rack CDUs and may provide a higher flow rate of coolant and/or coolant at lower temperatures.

Turning to FIG. 3.1, FIG. 3.1 shows a diagram of an information handling system (300) in accordance with one or more embodiments of the invention. The IHS (300) may include multiple chassis (e.g., 302A, 302B, 302C) disposed in the IHS (300).

As discussed above, the chassis may include computing devices that generate heat during operation. If left unchecked, a buildup of heat within a chassis may cause temperatures of the components disposed within the chassis to exceed preferred ranges. A first liquid cooling system (304) and a second liquid cooling system (306) are provided to remove heat from the chassis.

To do so, the first liquid cooling system (304) includes a first in-rack CDU (308) that provides a fluid flow to a first manifold (310). The first in-rack CDU (308) may include controllers (e.g., computing devices) to control flow characteristics, temperature, and/or pressure of fluid flowing through the first in-rack CDU (308). Further, the first in-rack CDU (308) may include a form factor such that it can fit in a space designed to fit a chassis.

Further, the first manifold (310) fits in a slot designed for a chassis. A manifold in this position may be considered a horizontal manifold. In one embodiment, the first manifold (310) fits within two chassis slots of the IHS (300). In one embodiment, the first manifold (310) is split into two pieces. The first piece may include inlets and the second piece may include outlets. The first manifold (310) may be split into more or less pieces without departing from the invention.

Continuing with the discussion of fluid flows, the liquid exits the first in-rack CDU (308) and flows along a first CDU supply flow and into the first manifold (310). The first manifold (310) includes outlets configured to supply fluid flows to the chassis and inlets configured to receive fluid flows from the chassis. For example, the first manifold (310) may include one outlet and one inlet for each chassis. The fluid then flows out of the first manifold (310) at a first coolant outlet and into chassis inlet (312). From there, the fluid passes through the chassis and exchanges heat with one or more components within the chassis to remove heat from the chassis. For a more detailed discussion of the fluid flows between the manifolds and the chassis, see FIG. 2.3 above.

Next, the fluid flows out of the chassis through a chassis outlet (314), and returns to the first manifold (310), entering the first manifold (310) through a first coolant inlet. The fluid then flows through the first manifold (310) and exits the manifold through a first manifold outlet. The fluid flows in a first CDU return flow and into the first in-rack CDU (308) through a first unit inlet. The fluid may then be processed (i.e., cooled) by the first in-rack CDU (308) and returned to the first CDU supply flow, or the fluid may flow out of the first in-rack CDU (308) and flow into a facility return line to be processed elsewhere.

The first liquid cooling system (304) may also include a number of devices to improve the reliability of the first liquid cooling system (304) and/or prevent leaks from spreading and possibly damaging other components within the IHS (300). For example, the first liquid cooling system (304) includes a first drain pan (316) positioned below the first manifold (310). The first drain pan (316) may include a container to receive any leaks that may form in the first liquid cooling system (304), thus containing the leak to a controlled area and preventing a leak from affecting areas below the drain pan. Further, the first drain pan (316) may include sensors capable of detecting a presence of a leak and may also include a computing device capable of receiving data indicative of a leak and providing an alert that a leak has occurred. For additional details regarding computing devices, refer to FIG. 4.

Further, the liquid cooling system may contain one or more first manifold valves (318). The manifold valves (318) are positioned between the first in-rack CDU (308) and the first manifold (310) and can be actuated to selectively provide fluid flow between the first in-rack CDU (308) and the first manifold (310). In the event that a user wishes fluid to stop flowing through the first manifold (310) (e.g., during a service interval, upon detection of a leak, etc.) the first manifold valve (318) may be closed, thereby stopping flow between the first in-rack CDU (308) and the first manifold (310). As discussed in greater detail in FIG. 2.2, there are also valves between the first manifold (310) and the chassis. Thus, a user can completely shut off fluid flows through the first manifold (310) while still maintaining liquid cooling for the IHS (e.g., via the second liquid cooling system (306)). Further, the first manifold valves (318) may be actuated manually or electronically. Electronic actuation of the first manifold valves (318) may be accomplished via a controller. For example, if a leak is detected (e.g., at the first drain pan (316)), the controller may actuate the first manifold valves (318) to block fluid flow between the first in-rack CDU (308) and the first manifold (310). The controller may be implemented using a computing device. For additional details regarding computing devices, refer to FIG. 4.

Any discussion relating to the first in-rack CDU (308) may apply to the second in-rack CDU (320), any discussion relating to the first manifold (310) may apply to the second manifold (322), any discussion relating to the first drain pan (316) may apply to the second drain pan (326), and any discussion relating to the first manifold valves (318) may apply to the second manifold valves (328).

By providing substantially the same functionality as the first liquid cooling system (304), the second liquid cooling system (306) provides enhanced reliability for the IHS (300). In turn, the IHS (300) may experience reduced downtime and may experience more time spent at maximum operating capacity due to continued liquid cooling during a manifold failure and/or maintenance.

Turning to FIG. 3.2, FIG. 3.2 shows a diagram of the information handling system (300) in accordance with one or more embodiments of the invention. The present embodiment differs from the embodiment illustrated in FIG. 3.1 in that the first in-rack CDU (308) is replaced with a first in-row CDU (340) and the second in-rack CDU (320) is replaced with a second in-row CDU (342). The in-row CDUs differ from in-rack CDUs in that they are not positioned within the frame (324) of the IHS (300). Rather, they are positioned at some other location. In this manner, the in-row CDUs may include a different form factor than in-rack CDUs. In some embodiments, in-row CDUs may be larger than in-rack CDUs and may provide a higher flow rate of coolant and/or coolant at lower temperatures.

Figure 4:
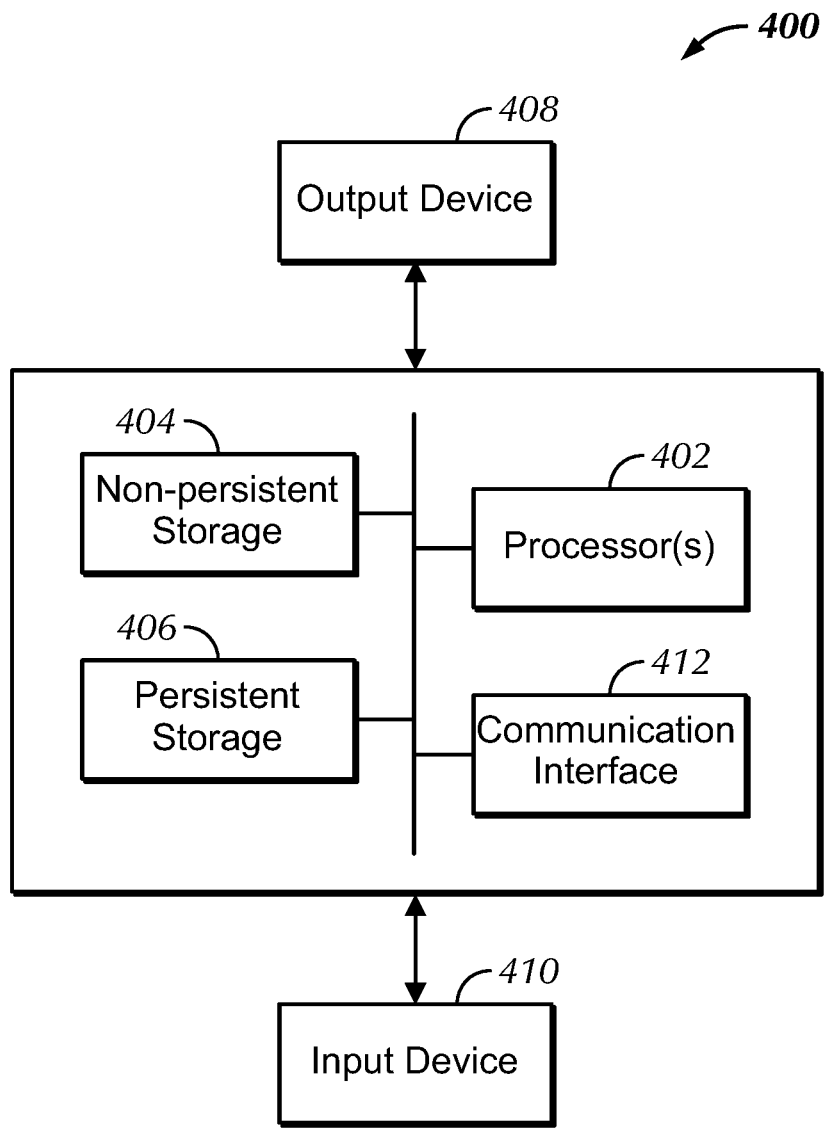
FIG. 4 shows a diagram of a computing device in accordance with one or more embodiments of the invention.

Embodiments of the invention may be implemented using a computing device. FIG. 4 shows a diagram of a computing device in accordance with one or more embodiments of the invention. The computing device (400) may include one or more computer processors (402), non-persistent storage (404) (e.g., volatile memory, such as random access memory (RAM), cache memory), persistent storage (406) (e.g., a hard disk, an optical drive such as a compact disk (CD) drive or digital versatile disk (DVD) drive, a flash memory, etc.), a communication interface (412) (e.g., Bluetooth interface, infrared interface, network interface, optical interface, etc.), input devices (410), output devices (408), and numerous other elements (not shown) and functionalities. Each of these components is described below.

In one embodiment of the invention, the computer processor(s) (402) may be an integrated circuit for processing instructions. For example, the computer processor(s) may be one or more cores or micro-cores of a processor. The computing device (400) may also include one or more input devices (410), such as a touchscreen, keyboard, mouse, microphone, touchpad, electronic pen, or any other type of input device. Further, the communication interface (412) may include an integrated circuit for connecting the computing device (400) to a network (not shown) (e.g., a local area network (LAN), a wide area network (WAN) such as the Internet, mobile network, or any other type of network) and/or to another device, such as another computing device.

In one embodiment of the invention, the computing device (400) may include one or more output devices (408), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (402), non-persistent storage (404), and persistent storage (406). Many different types of computing devices exist, and the aforementioned input and output device(s) may take other forms.

Embodiments of the invention may have an improved system for thermally managing IHSs. Specifically, embodiments of the invention may provide redundant cooling components such as manifolds. To increase the reliability and resiliency of a liquid cooling system, embodiments of the invention may provide redundant cooling components such as manifolds. Thus, if one of the manifolds fails and develops a leak, or if a manifold is closed off for some other purpose (e.g., maintenance), the manifold may be taken offline while a supply of liquid coolant flow to the IHS is maintained by the redundant manifold. By doing so, a system in accordance with embodiments of the invention may be less likely to prematurely fail and reduce liquid system cooling downtime, which may also reduce the amount of time the IHS spends in an unoptimized state.

Thus, embodiments of the invention may address the problem of enhancing the reliability and resiliency of liquid cooling systems. Specifically, embodiments of the invention may provide a system for providing redundant cooling system components to maintain normal operating conditions even if a manifold is taken offline.

The problems discussed above should be understood as being examples of problems solved by embodiments of the invention disclosed herein and the invention should not be limited to solving the same/similar problems. The disclosed invention is broadly applicable to address a range of problems beyond those discussed herein.

One or more embodiments of the invention may be implemented using instructions executed by one or more processors of the computing device (400). Further, such instructions may correspond to computer readable instructions that are stored on one or more non-transitory computer readable mediums.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. An information handling system comprising:
a plurality of chassis each comprising a chassis inlet and a chassis outlet;
a liquid cooling system comprising:
a first coolant distribution unit comprising a first unit inlet and a first unit outlet;
a first manifold comprising:
a plurality of first coolant outlets each configured to provide a first inlet coolant flow to a respective one of the chassis inlets;
a plurality of first coolant inlets each configured to receive a first outlet coolant flow from a respective one of the chassis outlets;
a first manifold inlet fluidly coupled to the first unit outlet and configured to provide the first inlet coolant flow;
a first manifold outlet fluidly coupled to the first unit inlet and configured to provide the first outlet coolant flow to the first coolant distribution unit;
a second coolant distribution unit comprising a second unit inlet and a second unit outlet;
a second manifold comprising:
a plurality of second coolant outlets each configured to provide a second coolant flow to the respective one of the chassis inlets;
a plurality of second coolant inlets each configured to receive a second outlet coolant flow from the respective one of the chassis outlets;

a second manifold inlet fluidly coupled to the second unit outlet and configured to provide the second inlet coolant flow; and a second manifold outlet fluidly coupled to the second unit inlet and configured to provide the second outlet coolant flow from the second section to the second coolant distribution unit.

2. The information handling system of claim 1, wherein the liquid cooling system further comprises:

a first inlet check valve fluidly coupled between the respective one of the chassis inlets and the respective one of the first coolant outlets, wherein the first inlet check valve is configured to close in response to a pressure of the first inlet coolant flow being below a first threshold; and a second inlet check valve fluidly coupled between the respective one of the chassis inlets and the respective one of the second coolant outlets, wherein the second inlet check valve is configured to close in response to a pressure of the second inlet coolant flow being below a second threshold.

3. The information handling system of claim 2, wherein the first threshold and the second threshold are the same.

4. The information handling system of claim 1, wherein the liquid cooling system further comprises:

a first outlet check valve fluidly coupled between the respective one of the chassis outlets and the respective one of the first coolant inlets, wherein the first outlet check valve is configured to close in response to a pressure of the first outlet coolant flow being below a first threshold; and a second outlet check valve fluidly coupled between the respective one of the chassis outlets and the respective one of the second coolant inlets, wherein the second outlet check valve is configured to close in response to a pressure of the second outlet coolant flow being below a second threshold.

5. The information handling system of claim 1, wherein the first coolant distribution unit is positioned in a first rack of the information handling system and the second coolant distribution unit is positioned in a second rack of the information handling system.

6. The information handling system of claim 1, wherein the first and second manifolds extend vertically in the information handling system.

7. The information handling system of claim 1, wherein the first and second manifolds extend horizontally in the information handling system.

8. The information handling system of claim 1, wherein the first and second manifolds are positioned within at least one rack of the information handling system.

9. The information handling system of claim 1, wherein the liquid cooling system further comprises:

an inlet manifold valve coupled between the first manifold inlet and the first unit outlet; and an outlet manifold valve coupled between the first manifold outlet and the first unit inlet.

10. The information handling system of claim 9, wherein the liquid cooling system further comprises a drain pan positioned below the first manifold, and wherein the inlet manifold valve and the outlet manifold valve are configured to close in response to a presence of water in the drain pan.

11. An information handling system comprising:
a chassis comprising a chassis inlet and a chassis outlet;
a liquid cooling system comprising:
a first manifold comprising:

a first chassis outlet configured to provide a first inlet coolant flow to the chassis inlet;

a first chassis inlet configured to receive a first outlet coolant flow from the chassis outlet;

a second manifold comprising:

a second chassis outlet configured to provide the first inlet coolant flow to the chassis inlet; and a second chassis inlet configured to receive the first outlet coolant flow from the chassis outlet.

12. The information handling system of claim 11, wherein the liquid cooling system further comprises:

a first inlet check valve fluidly coupled between the respective one of the chassis inlets and the respective one of the first coolant outlets, wherein the first inlet check valve is configured to close in response to a pressure of the first inlet coolant flow being below a first threshold; and a second inlet check valve fluidly coupled between the respective one of the chassis inlets and the respective one of the second coolant outlets, wherein the second inlet check valve is configured to close in response to a pressure of the second inlet coolant flow being below a second threshold.

13. The information handling system of claim 12, wherein the liquid cooling system further comprises:

a first outlet check valve fluidly coupled between the respective one of the chassis outlets and the respective one of the first coolant inlets, wherein the first outlet check valve is configured to close in response to a pressure of the first outlet coolant flow being below a third threshold; and a second outlet check valve fluidly coupled between the respective one of the chassis outlets and the respective one of the second coolant inlets, wherein the second outlet check valve is configured to close in response to a pressure of the second outlet coolant flow being below a fourth threshold.

14. The information handling system of claim 13, wherein the first inlet check valve is coupled to the first outlet check valve such that falling below the first or third threshold causes both the first inlet check valve and the first outlet check valve to close.

15. The information handling system of claim 14, wherein the second inlet check valve is coupled to the second outlet check valve such that falling below the second or fourth threshold causes both the second inlet check valve and the second outlet check valve to close.

16. The information handling system of claim 11, wherein the first and second manifolds extend vertically in the information handling system.

17. The information handling system of claim 11, wherein the first and second manifolds extend horizontally in the information handling system.

18. An information handling system comprising:
a plurality of chassis each comprising a chassis inlet and a chassis outlet; and
a liquid cooling system comprising:

a first coolant distribution unit comprising a first unit inlet and a first unit outlet;

a first manifold comprising:

a plurality of first coolant outlets each configured to provide a first inlet coolant flow to a respective one of the chassis inlets;

a plurality of first coolant inlets each configured to receive a first outlet coolant flow from a respective one of the chassis outlets;

a first manifold inlet fluidly coupled to the first unit outlet and configured to provide the first inlet coolant flow;

a first manifold outlet fluidly coupled to the first unit inlet and configured to provide the first outlet coolant flow to the first coolant distribution unit;

a first inlet check valve fluidly coupled between the respective one of the chassis inlets and the respective one of the first coolant outlets, wherein the first inlet check valve is configured to close in response to a pressure of the first inlet coolant flow being below a first threshold;

a first outlet check valve fluidly coupled between the respective one of the chassis outlets and the respective one of the first coolant inlets, wherein the first outlet check valve is configured to close in response to a pressure of the first outlet coolant flow being below a first threshold;

a second coolant distribution unit comprising a second unit inlet and a second unit outlet;

a second manifold comprising:

a plurality of second coolant outlets each configured to provide a second coolant flow to the respective one of the chassis inlets;

a plurality of second coolant inlets each configured to receive a second outlet coolant flow from the respective one of the chassis outlets;

a second manifold inlet fluidly coupled to the second unit outlet and configured to provide the second inlet coolant flow; and a second manifold outlet fluidly coupled to the second unit inlet and configured to provide the second outlet coolant flow from the second section to the second coolant distribution unit;

a second outlet check valve fluidly coupled between the respective one of the chassis outlets and the respective one of the second coolant inlets, wherein the second outlet check valve is configured to close in response to a pressure of the second outlet coolant flow being below a second threshold; and a second inlet check valve fluidly coupled between the respective one of the chassis inlets and the respective one of the second coolant outlets, wherein the second inlet check valve is configured to close in response to a pressure of the second inlet coolant flow being below a second threshold.

19. The information handling system of claim 18, wherein the liquid cooling system further comprises:

an inlet manifold valve coupled between the first manifold inlet and the first unit outlet; and an outlet manifold valve coupled between the first manifold outlet and the first unit inlet.

20. The information handling system of claim 19, wherein the liquid cooling system further comprises a drain pan positioned below the first manifold, and wherein the inlet manifold valve and the outlet manifold valve are configured to close in response to a presence of water in the drain pan.

* * * * *